United States Patent [19]

Tatsuta et al.

[11] Patent Number: 5,712,879
[45] Date of Patent: Jan. 27, 1998

[54] DIFFERENTIAL DETECTING DEVICE

[75] Inventors: Akihiro Tatsuta, Nara; Yoshio Urabe, Ibaraki; Hitoshi Takai, Osaka, all of Japan

[73] Assignee: Matsushita Electric Industrial Co., Ltd., Osaka-fu, Japan

[21] Appl. No.: 506,321

[22] Filed: Jul. 24, 1995

[30] Foreign Application Priority Data

Jul. 27, 1994 [JP] Japan .................... 6-175478

[51] Int. Cl.$^6$ .................... H04L 27/22; H04L 27/06
[52] U.S. Cl. .................... 375/330; 375/340
[58] Field of Search .................... 375/330, 283, 375/329, 279; 370/533, 537, 328; 329/304, 305, 310

[56] References Cited

U.S. PATENT DOCUMENTS

| | | | |
|---|---|---|---|
| 3,668,291 | 6/1972 | Slana | 370/537 |
| 3,818,143 | 6/1974 | Vrba et al. | 370/537 |
| 3,838,296 | 9/1974 | McLeod | 370/537 |
| 3,967,069 | 6/1976 | Dorren . | |
| 4,184,052 | 1/1980 | Norris et al. | 370/537 |
| 4,481,640 | 11/1984 | Chow et al. | 375/283 |
| 4,546,389 | 10/1985 | Gibson et al. | 358/342 |
| 4,740,997 | 4/1988 | Heatherington | 370/328 |
| 4,755,761 | 7/1988 | Ray, Jr. | 375/322 |
| 4,809,203 | 2/1989 | Wilson et al. . | |
| 4,893,316 | 1/1990 | Jane et al. . | |
| 4,965,797 | 10/1990 | Yamane et al. | 370/537 |
| 4,965,810 | 10/1990 | Peischl et al. . | |
| 4,974,058 | 11/1990 | Takayama | 370/537 |
| 5,007,068 | 4/1991 | Simon et al. | 375/331 |
| 5,045,789 | 9/1991 | Inoue et al | 324/225 |
| 5,227,987 | 7/1993 | Imazawa et al. . | |
| 5,379,323 | 1/1995 | Nakaya | 329/304 |
| 5,541,966 | 7/1996 | Bolla et al. | 375/329 |

FOREIGN PATENT DOCUMENTS

| | | |
|---|---|---|
| 091265 | 3/1982 | European Pat. Off. . |
| 5103027 | 4/1993 | Japan . |

OTHER PUBLICATIONS

Jacob Millman, "Microelectronics Digital and Analog Circuits and systems," McGraw-Hill, pp. 186–188, 1979.

*Primary Examiner*—Tesfaldet Bocure
*Attorney, Agent, or Firm*—Price, Gess & Ubell

[57] ABSTRACT

A signal adding device and a differential signal detecting device, wherein the signal adding device adds n input signals using n A/D converters, a selector and a lowpass filter. The n input signals are sampled in sequence by the A/D converter and digitized. Each digitized data is time-division multiplexed by the selector and input to the lowpass filter. The output of the lowpass filter is equal to an added signal of n input signals. The differential signal detecting device detects from inphase and quadrature-phase baseband signals the sine and cosine components of a phase difference at two instants of the phase-modulated signal. Two A/D converters digitize and convert the inphase and quadrature-phase baseband signals to inphase data and quadrature-phase data at predetermined intervals. A cosine component calculating unit calculates the cosine component by alternately selecting the inphase data and the quadrature-phase data. Similarly, a sine component calculating unit calculates the sine component by alternately selecting the inphase data and the quadrature-phase data. Two selectors select either the inphase data or the quadrature-phase data at predetermined intervals. By alternately selecting the inphase data and quadrature-phase data, and then multiplying the results, differential detection can be achieved with fewer multipliers and adders than the prior art differential detecting devices.

5 Claims, 11 Drawing Sheets

| n | F1(nT) : present embodiment<br>E1(nT) : prior art | F2(nT) : present embodiment<br>E2(nT) : prior art |
|---|---|---|
| 1 | I(T)*I(−3T) | I(−3T)*Q(T) |
|   | no output | no output |
| 2 | Q(2T)*Q(−2T) | −I(2T)*Q(−2T) |
|   | I(2T)*I(−2T)+Q(2T)*Q(−2T) | I(−2T)*Q(2T)−I(2T)*Q(−2T) |
| 3 | I(3T)*I(−T) | I(−T)*Q(3T) |
|   | no output | no output |
| 4 | Q(4T)*Q(0) | −I(4T)*Q(0) |
|   | I(4T)*I(0)+Q(4T)*Q(0) | I(0)*Q(4T)−I(4T)*Q(0) |
| 5 | I(5T)*I(−T) | I(T)*Q(5T) |
|   | no output | no output |
| 6 | Q(6T)*Q(2T) | −I(6T)*Q(2T) |
|   | I(6T)*I(2T)+Q(6T)*Q(2T) | I(2T)*Q(6T)−I(6T)*Q(2T) |
| 7 | I(7T)*I(3T) | I(3T)*Q(7T) |
|   | no output | no output |
| 8 | Q(8T)*Q(4T) | −I(8T)*Q(4T) |
|   | I(8T)*I(4T)+Q(8T)*Q(4T) | I(8T)*Q(4T)−I(8T)*Q(4T) |

DIFFERENTIAL DETECTING DEVICE

BACKGROUND OF THE INVENTION

1. Field of the Invention

This invention relates to a signal adding device for adding received multiple signals in digital signal processing and also relates to a differential detecting device that handles phase-modulated signals with the above signal adding device, and specifically relates to a signal adding device and differential detecting device realized in small-scale logical circuits.

2. Description of the Prior Art

Recently, in the field of mobile communications, differential detecting devices handling phase-modulated signals have often been used. This is because the differential detecting method is less affected by a phenomenon called fading, a disturbance unique to mobile communications.

Japanese Laid-Open Patent Application No. 63-153942 and Japanese Laid-Open Utility Model No. 2-70542 disclose techniques concerning differential detecting devices in digital signal processing. These prior-art differential detecting devices are explained below with reference to the drawings.

Figure 1:
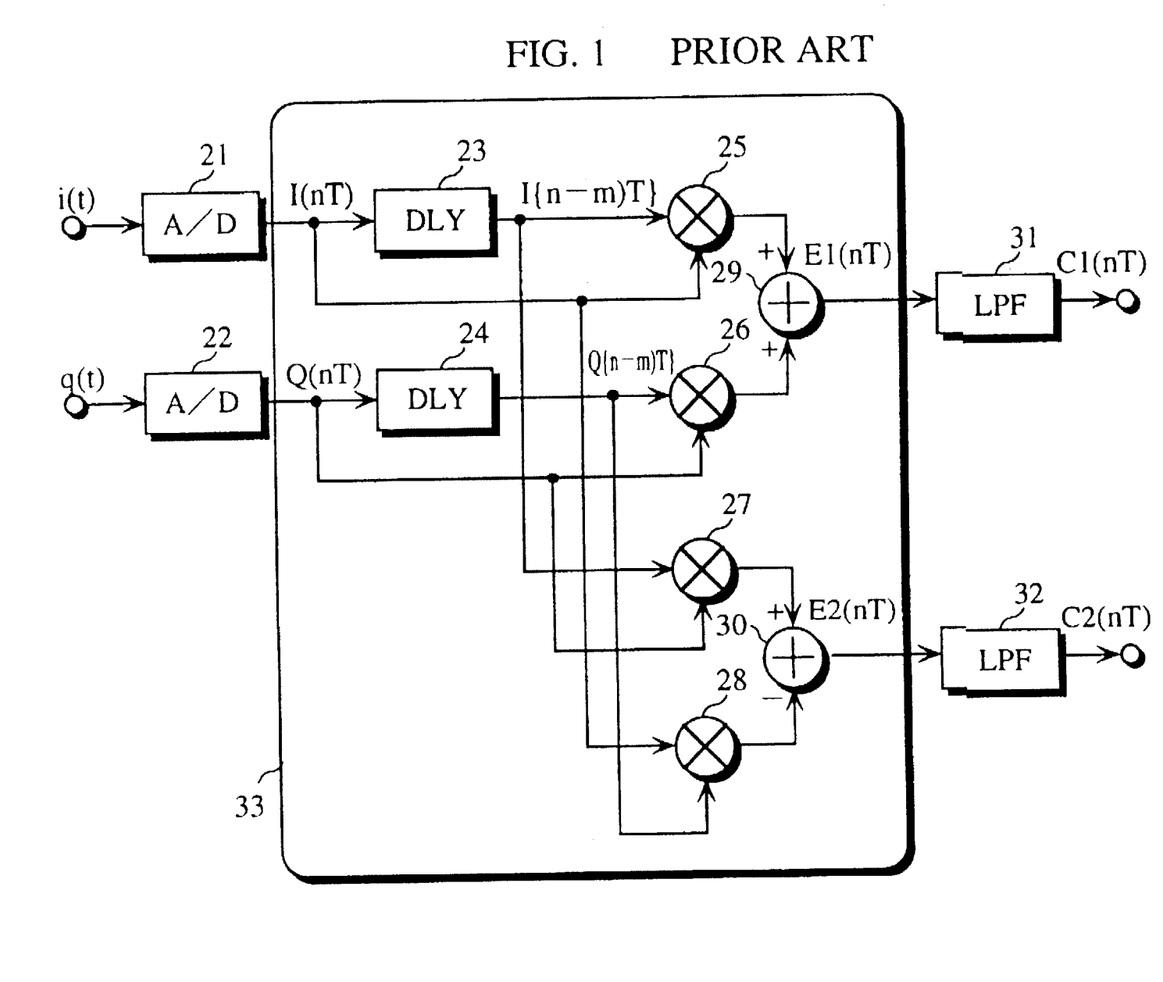
FIG. 1 is a block diagram illustrating the structure of a prior-art differential detecting device.

FIG. 1 shows a structure of a prior-art differential detecting device. 21 and 22 represent A/D converters that sample inphase and quadrature-phase baseband signals i(t) and q(t). Inphase and quadrature-phase baseband signals i(t) and q(t) are obtained by performing the quasi-synchronous quadrature-phase detection on the modulated signal; that means, by multiplying the input signal with two respective local signals having the same frequency as the input carrier wave and differing each other by angle of 90 degrees. Differential detection calculating unit 33 comprises delays 23 and 24, multipliers 25, 26, 27, and 28, and adders 29 and 30. 31 and 32 represent lowpass filters. The differential detecting device with the above composition is explained below on its operation.

Sampled inphase baseband signal I(nT) sampled by A/D converter 21 goes two ways, one of which directly enters multiplier 25, and the other is delayed by delay 23 one symbol time mt to change to I{(n-m)T} then enters multiplier 25, where n indicates the sequential sampling number, m the number of sampling in one symbol time, and T the period of sampling. The term symbol indicates the unit with which data is modulated by the transmitter.

Also, sampled quadrature-phase baseband signal Q(nT) sampled by A/D converter 22 goes two ways, one of which directly enters multiplier 26, and the other is delayed by delay 24 one symbol time mt to change to Q{(n-m)T} then enters multiplier 26. Adder 29 adds the outputs from multiplier 25 and 26 and outputs detection output E1(nT). Adder 30 outputs another detection output E2(nT) with the following procedure: first, outputs from delay 23 and A/D converter 22 are input to multiplier 27, then outputs from delay 24 and A/D converter 21 are input to multiplier 28, and outputs from the multiplier 27 and 28 are input to adder 30 which outputs E2(nT). In this way, vector calculations on sampling baseband signals I(nT)+jQ(nT) and I{(n-m)T}+jQ{(n-m)T}, where j is an imaginary number, are performed to detect the phase difference.

Furthermore, detection outputs E1(nT) and E2(nT) from respective adders 29 and 30 are input to lowpass filters 31 and 32 respectively, by which unnecessary high-frequency elements generated by A/D converters 21 and 22 in digitization are filtered to gain demodulated baseband signals C1(nT) C2(nT).

The above vector calculation in differential detection calculating unit 33 is explained below with the aid of the formulas.

It is assumed that data of phase $\theta$ is $I(nT)+jQ(nT)$ and the previous data (one symbol before) of phase $\theta'$ is $I\{(n-m)T\}+jQ\{(n-m)T\}$. The relation is shown in Formula 1.

Formula 1

$$I(nT)=\cos\theta$$
$$Q(nT)=\sin\theta$$
$$I\{(n-m)T\}=\cos\theta'$$
$$Q\{(n-m)T\}=\sin\theta'$$

Then, on data of the phase difference $(\theta-\theta')$, cosine component E1(nT) and sine component E2(nT) are obtained from Formula 2 below.

Formula 2

$$E1(nT)=\cos(\theta-\theta')$$
$$=\cos\theta\cos\theta'+\sin\theta\sin\theta'$$
$$=I(nT)\cdot I\{(n-m)T\}+Q(nT)\cdot Q\{(n-m)T\}$$
$$E2(nT)=\sin(\theta-\theta')$$
$$=\sin\theta\cos\theta'-\cos\theta\sin\theta'$$
$$=Q(nT)\cdot I\{(n-m)T\}-I(nT)\cdot Q\{(n-m)T\}$$

As shown above, the prior-art differential detecting device performs the differential detection by digitizing the phase-modulated signal and then by performing the vector calculations shown in Formula 2.

However, the prior-art differential detecting device requires at least four multipliers, two adders, and two delays of hardware for the vector calculations, and also its circuit requires too many gates to be put into IC. So, only a large-scale IC or multiple ICs can realize all those hardware, and this has been an obstacle to provide a compact, lightweight, and low-price communication equipment using such differential detecting device.

SUMMARY OF THE INVENTION

The first object of the present invention, in consideration of the above mentioned problems, is to provide a signal adding device with small-scale logical circuit. The second object of the present invention is to provide a differential detecting device easily put into IC, which is enabled by reducing the hardware components required for vector calculations.

The first object is achieved by a signal adding device for adding n input signals with frequency fb or lower and outputting an added signal, fb being a real number, and n being an integer greater than 0, comprising: a multiplexing unit for multiplexing the n input signals in time-division at time Δt intervals, multiplexing all the n input signals at least once, Δt being ½nfb or shorter; and a lowpass filter for cutting frequency components with frequency (1/nΔt)-fb or higher from signals output from the multiplexing unit and passing frequency components with frequency fb or lower; and an outputting unit for outputting signals which have passed the lowpass filter as the added signal.

The multiplexing unit of the device may comprise: an analog signal selector for selecting each of the n input signals in sequence and selecting all the n input signals in time period ½fb or shorter; and an A/D converter for sampling and digitizing each of the input signals output from the analog signal selector, and outputting sampled digital signals to the lowpass filter.

The multiplexing unit of the device may also comprise: n A/D converters each of which samples and digitizes a corresponding one of the n input signals at every time period nΔt and outputs m-bit data, nΔt being ½nfb or shorter, the n A/D converters performing sampling with time difference Δt between each other, m being an integer greater than 0; and a selector which, synchronized with digitizations by the n A/D converters, sequentially selects one from n pieces of the m-bit data output from the n A/D converters and outputting selected m-bit data to the lowpass filter.

The data sequence generated via the selector and A/D converters is then input to the lowpass filter to be output as a signal with only the baseband components. The output signal is equal to the signal obtained by the prior-art signal adding device with adders. It shows that adders required in the prior art can be replaced with selectors, which can be realized in a circuit with less gates.

The second object is achieved by a differential detecting device for detecting, from inphase and quadrature-phase baseband signals which are obtained by a quadrature detection on a phase-modulated signal, cosine and sine components of a phase difference at two instants of the phase-modulated signal, comprising: two A/D converters for digitizing and converting the inphase and quadrature-phase baseband signals to respective inphase data and quadrature-phase data at every predetermined time period (symbol); a cosine component calculating unit for multiplying the inphase data by previous inphase data predetermined symbols earlier, multiplying the quadrature-phase data by previous quadrature-phase data the predetermined symbols earlier, and alternately outputting their multiplication results at every symbol in time-division multiplexing; a sine component calculating unit for multiplying the quadrature-phase data by inphase data the predetermined symbols earlier, multiplying the inphase data by quadrature-phase data the predetermined symbols earlier, and alternately outputting their multiplication results at every symbol in time-division multiplexing, wherein for a case of multiplication of the inphase data by quadrature-phase data the predetermined symbols earlier, the sine component calculating unit inverts its multiplication result; and two lowpass filters for receiving respective data sequences from the cosine component calculating unit and the sine component calculating unit, cutting frequency components whose frequencies are higher than first predetermined frequency level from the data sequences, and passing frequency components of the data sequences whose frequencies are lower than second predetermined frequency level, the second predetermined frequency level being lower than the first frequency level.

The cosine component calculating unit of the device may comprise: a first selector for selecting the inphase data and the quadrature-phase data alternately at every symbol; a delay for delaying data selected by the first selector for the predetermined number of symbols; and a first multiplier for multiplying data selected by the first selector by data delayed by the delay, and the sine component calculating unit comprises: an inverter for inverting the inphase data; a second selector, operating synchronously with the first selector, for selecting the quadrature-phase data when the first selector selects the inphase data, and selecting output data of the inverter when the first selector selects the quadrature-phase data; and a second multiplier for multiplying data selected by the second selector by data delayed by the delay.

The cosine component calculating unit of the device may also comprise: a first selector for selecting the inphase data and the quadrature-phase data alternately at every symbol; a delay for delaying data selected by the first selector for the predetermined number of symbols; and a first multiplier for multiplying data selected by the first selector by data delayed by the delay, and the sine component calculating unit comprises: a second selector, operating synchronously with the first selector, for selecting the quadrature-phase data when the first selector selects the inphase data, and selecting the inphase data when the first selector selects the quadrature-phase data; an inverter for inverting and outputting the inphase data selected by the second selector and outputting the quadrature-phase data selected by the second selector as it is; and a second multiplier for multiplying data output from the inverter by data delayed by the delay.

The cosine component calculating unit obtains alternately two kinds of values on the cosine component of a phase difference of a modulated signal, and outputs the obtained values to the lowpass filter in time-division multiplexing. The lowpass filter outputs a signal consisting of only baseband components. The signal is equal to the cosine component of the phase difference of the modulated signal. The sine component calculating unit similarly outputs the sine component of the signal.

The above device is realized in the circuit with only two multipliers and one delay instead of four multipliers and two delays required in the prior art. Furthermore, two adders used in the prior art are no more required.

BRIEF DESCRIPTION OF THE DRAWINGS

These and other objects, advantages and features of the invention will become apparent from the following description thereof taken in conjunction with the accompanying drawings which illustrate a specific embodiment of the invention. In the drawings.

DESCRIPTION OF THE PREFERRED EMBODIMENTS

<First Embodiment>

Figure 2:
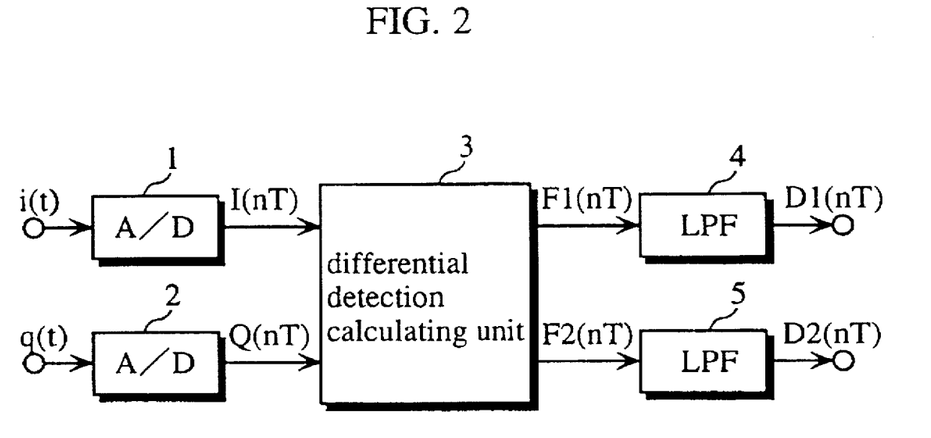
FIG. 2 is a block diagram illustrating the structure of the differential detecting device in First Embodiment of the present invention.

FIG. 2 is a block diagram illustrating the structure of the differential detecting device in the first embodiment of the present invention. In FIG. 2, 1 represents first A/D converter, 2 second A/D converter, 3 differential detection calculating unit, 4 first lowpass filter, and 5 second lowpass filter. First A/D converter 1 samples inphase baseband signal i(t), and inputs sampled baseband signal I(nT) to differential detection calculating unit 3. Second A/D converter 2 samples quadrature-phase baseband signal q(t), and inputs sampled baseband signal Q(nT) to differential detection calculating unit 3. Differential detection calculating unit 3 performs the calculations shown in Formula 3 below on the sampled baseband signals I(nT) and Q(nT), inputs detection signal F1(nT) to first lowpass filter 4, and F2(nT) to second lowpass filter 5. First lowpass filter 4 and second lowpass filter 5 lowpass-filter detection signals F1(nT) and F2(nT) and obtain demodulated baseband signals D1(nT) and D2(nT) respectively.

Formula 3

$$\text{For odd number n:}$$
$$F1(nT)=I(nT)\cdot I\{(n-m)T\}$$
$$F2(nT)=I\{(n-m)T\}\cdot Q(nT)$$
$$\text{For even number n:}$$
$$F1(nT)=Q(nT)\cdot Q\{(n-m)T\}$$
$$F2(nT)=-I(nT)\cdot Q\{(n-m)T\}$$

All the digital data handled in this embodiment are eight-bit data, though it is not clear in FIG. 2. Therefore, first A/D converter 1 and second A/D converter 2 output eight-bit data respectively, and as for input/output of differential detection calculating unit 3, and inputs of first lowpass filter 4 and second lowpass filter 5, data is passed over the eight-bit buses. The components 3, 4, and 5 are realized in logical circuits that handle eight-bit data. Though it is not described in the figure, a clock oscillator sends a clock signal to each component so that it can operate synchronously with the signal.

Figure 3:
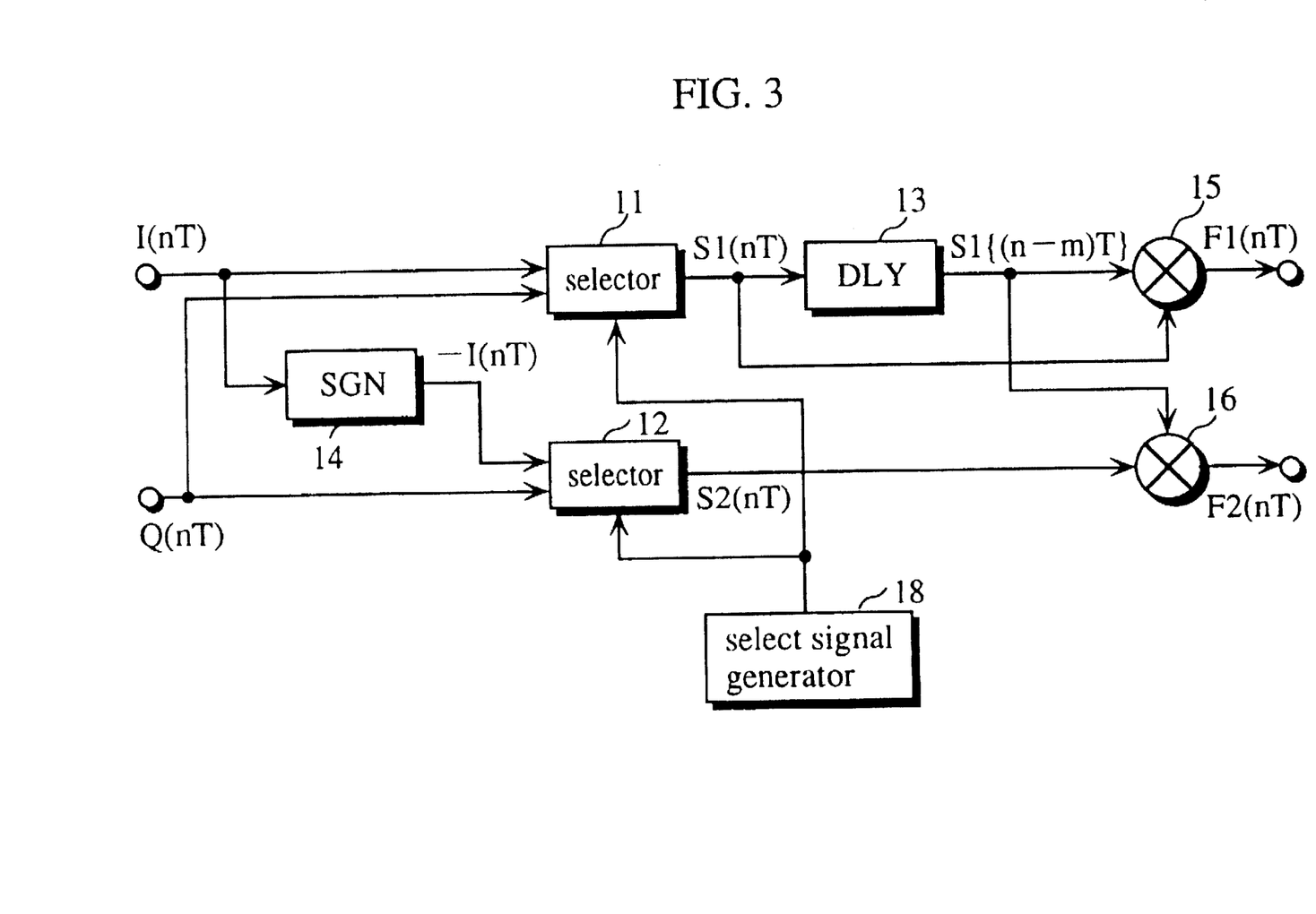
FIG. 3 is a block diagram illustrating the structure of the differential detection calculating unit in First Embodiment of the present invention.

FIG. 3 illustrates the structure of the differential detection calculating unit 3. The differential detection calculating unit 3 comprises first selector 11, second selector 12, delay 13, inverter 14, first multiplier 15, second multiplier 16, and select signal generator 18, and performs the calculations shown in Formula 3.

The operation of the differential detection calculating unit 3 with the above structure is explained with FIG. 3.

Both sampled baseband signals I(nT) and Q(nT) are input to first selector 11 and second selector 12 respectively. Sampled baseband signal I(nT) is inverted by inverter 14 to −I(nT) before it is input to second selector 12. First selector 11 operates synchronously with the clock signal from select signal generator 18, and outputs data S1(nT) by selecting alternately I(nT) and Q(nT) which are input simultaneously at every sampling period T. On the other hand, second selector 12 operates synchronously with the clock signal from select signal generator 18, but selects alternately −I(nT) and Q(nT) to output data S2(nT).

Output data S1(nT) of first selector 11 goes two ways, one of which directly enters first multiplier 15, the other is delayed one symbol time mT by delay 13 to change to S1{(n−m)T} and goes two ways to enter first multiplier 15 and second multiplier 16. On the other hand, output S2(nT) of second selector 12 directly enters second multiplier 16. The outputs of the selectors are shown in Formula 4.

Formula 4

$$\text{For odd number n:}$$
$$S1(nT)=I(nT)$$
$$S1\{(n-m)T\}=I\{(n-m)T\}$$
$$S2(nT)=Q(nT)$$
$$\text{For even number n:}$$
$$S1(nT)=Q(nT)$$
$$S1\{(n-m)T\}=Q\{(n-m)T\}$$
$$S2(nT)=-I(nT)$$

Hence, output F1(nT) of first multiplier 15 can be expressed as Formula 5.

Formula 5

$$\text{For odd number n:}$$
$$F1(nT)=S1(nT)\cdot S1\{(n-m)T\}$$
$$=I(nT)\cdot I\{(n-m)T\}$$
$$\text{For even number n:}$$
$$F1(nT)=S1(nT)\cdot S1\{(n-m)T\}$$
$$=Q(nT)\cdot Q\{(n-m)T\}$$

Output F2(nT) of second multiplier 16 can be expressed as Formula 6.

Formula 6

$$\text{For odd number n:}$$
$$F2(nT)=S2(nT)\cdot S1\{(n-m)T\}$$
$$=Q(nT)\cdot I\{(n-m)T\}$$
$$\text{For even number n:}$$
$$F2(nT)=S2(nT)\cdot S1\{(n-m)T\}$$
$$=-I(nT)\cdot Q\{(n-m)T\}$$

Figure 4:
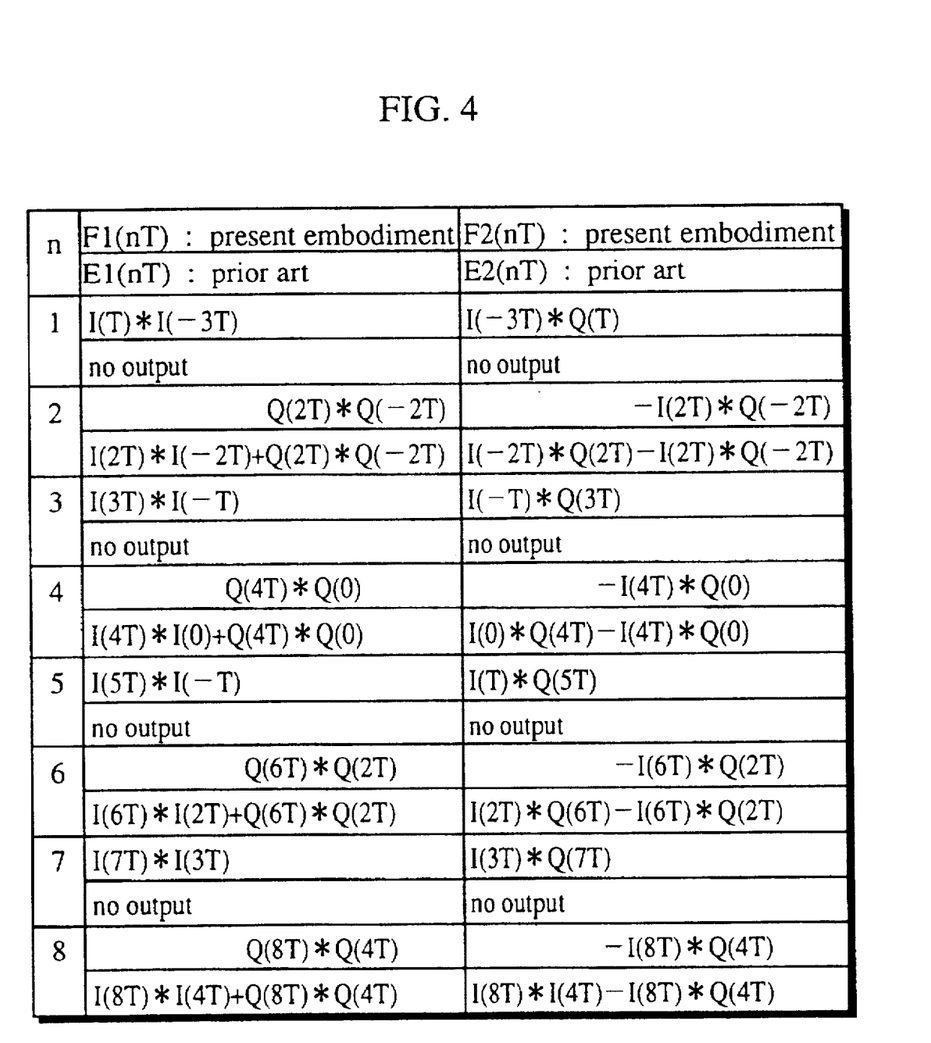
FIG. 4 is a table showing the time-series change of detection signals F1(nT) and F2(nT) in First Embodiment of the present invention.

Detection signals F1(nT) and F2(nT) are generated as above. Now, it is assumed that the sampling speed in the present embodiment is twice that of the prior art. FIG. 4 is a table showing the time-series change of detection signals F1(nT) and F2(nT). Detection signals E1(nT) and E2(nT) of the prior art are shown for comparison. It is assumed that integer n takes the values from 1 to 8 and m, number of samples per one symbol, is 4.

As FIG. 4 shows, detection signal F1(nT) alternately takes multiplication results of sampled inphase and quadrature-phase baseband signals at every sampling, namely I(nT)·I{(n−m)T} and Q(nT)·Q{(n−m)T}. On the other hand, prior-art detection signal E1(nT) sampled at every second sampling takes the addition result of I(nT)·I{(n−m)T} and Q(nT)·Q{(n−m)T}. Similarly, detection signal F2(nT) alternately takes multiplication results of sampled inphase and quadrature-phase baseband signals, namely I{(n−m)T}·Q(nT) and −I(nT)·Q{(n−m)T}. And prior-art detection signal E2(nT) takes the addition result of I{(n−m)T}·Q(nT) and −I(nT)·Q{(n−m)T}.

That is, detection signal F1(nT) of the present embodiment alternately takes the two items of the multiplication in time division. The two items are added to make prior-art detection signal E1(nT). This is the same for relation between signals F2(nT) and E2(nT). These relations can be confirmed also in FIG. 5.

How demodulated baseband signal D1(nT) is generated is explained below with reference to FIG. 5.

Figure 5:
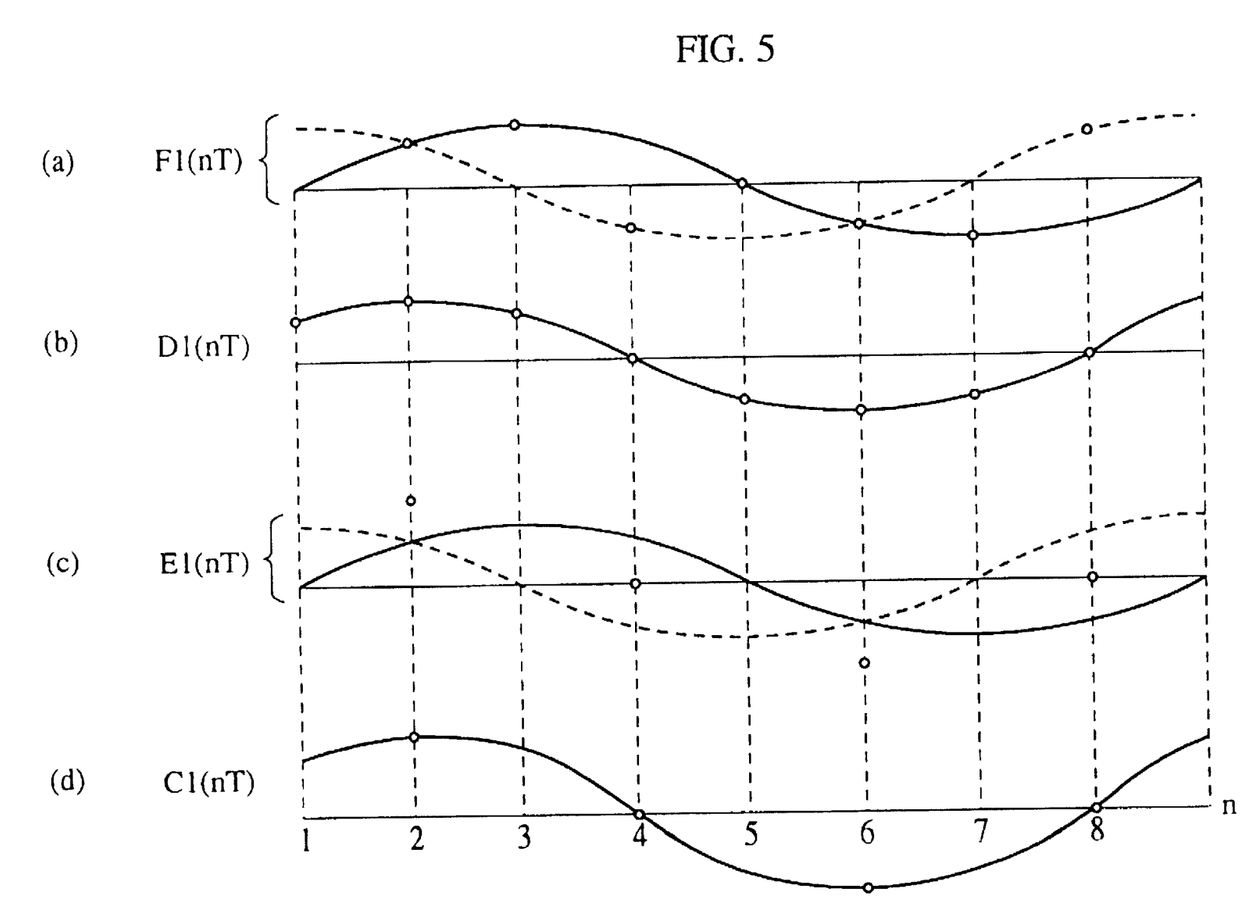
FIG. 5 shows the wave forms of the detection signals and demodulated baseband signals in First Embodiment of the present invention.

FIG. 5 shows waveforms of detection signal F1(nT), prior-art detection signal E1(nT), demodulated baseband signal D1(nT), and prior art demodulated baseband signal C1(nT). It is assumed as in FIG. 4 that integer n takes the values from 1 to 8 and m is 4.

In FIG. 5, signs ○ in (a) represent the values of detection signal F1(nT). Each sign ○ on continuous line in (a) represents the multiplication result of sampled inphase baseband signals, $I(nT) \cdot I\{(n-m)T\}$, and each sign ○ on broken line represents the multiplication result of sampled quadrature-phase baseband signals, $Q(nT) \cdot Q\{(n-m)T\}$.

On the other hand, signs ○ in (c) represent the values of prior-art detection signal E1(nT), each of which is the addition result of the multiplication result of sampled inphase baseband signals, $I(nT) \cdot I\{(n-m)T\}$, and the multiplication result of sampled quadrature-phase baseband signals, $Q(nT) \cdot Q\{(n-m)T\}$.

Signs ○ on smoothed continuous line in (d) represent the values of prior-art demodulated baseband signal C1(nT), which is the lowpass-filtered detection signal E1(nT). Similarly, signs ○ on smoothed continuous line in (b) represent the values of demodulated baseband signal D1(nT), which is the lowpass-filtered detection signal F1(nT). The continuous line in (b) and (d) are the same, as it is understood by comparing them. Consequently, it can be said that lowpass-filtering detection signal F1(nT) in (a) has generated baseband signal D1(nT), which is equal to prior-art demodulated baseband signal C1(nT).

From the above fact it follows that the present device does not require adder 29, which is used in the prior-art device to add multiplication results of inphase and quadrature-phase baseband signals, $I(nT) \cdot I\{(n-m)T\}$ and $Q(nT) \cdot Q\{(n-m)T\}$. Note that in the present embodiment it is possible to use the same lowpass filter as the prior art.

Although FIG. 5 shows only detection signal F1(nT) and demodulated baseband signal D1(nT), the relation can be applied to detection signal F2(nT) and demodulated baseband signal D2(nT). Namely, lowpass-filtering detection signal F2(nT) generates baseband signal D2(nT) that is equal to prior art demodulated baseband signal C2(nT).

As apparent from the above description, the present embodiment realizes the logical circuit of differential detecting device with only two multipliers, one delay and newly put two selectors instead of four multipliers and two delays in the prior art. Furthermore, two adders used in the prior art are no more required. As a result, the present circuit can be made of less gates, and it eases realizing it in IC. It goes without saying that in the present device the number of gates decreases as the A/D converter increases the digitization resolution, namely the number of bits in a piece of data in digitization.

<Second Embodiment>

Figure 6:
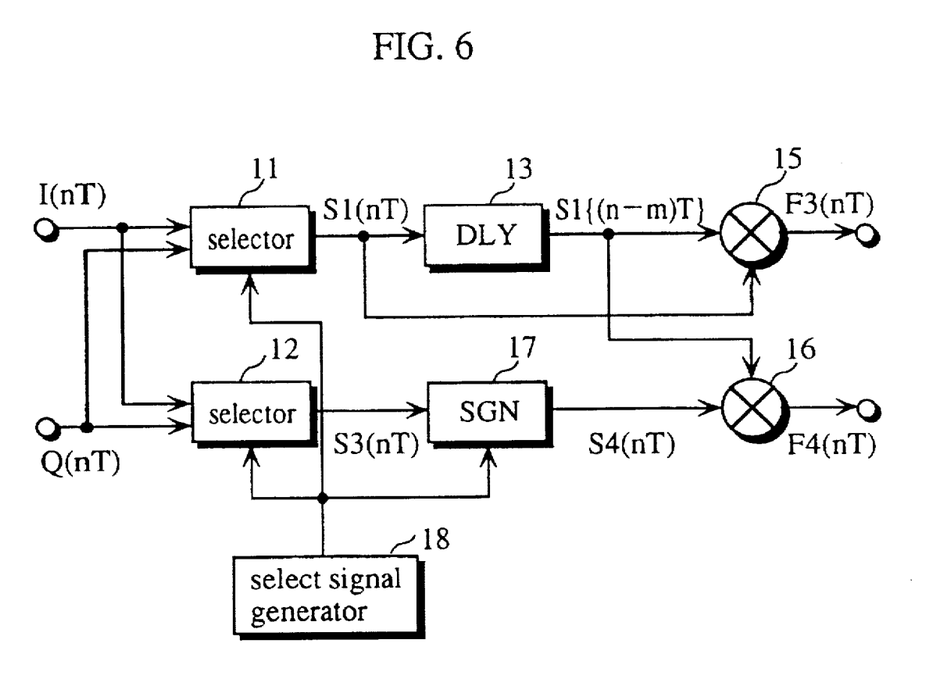
FIG. 6 is a block diagram illustrating the structure of the differential detecting device in Second Embodiment of the present invention.

The differential detecting device in the second embodiment of the present invention is explained with reference to the figures. The structure of the differential detecting device in the second embodiment is the same as the block diagram in FIG. 2. FIG. 6 shows the structure of differential detection calculating unit 3. The differential detection calculating unit 3 comprises first selector 11, second selector 12, delay 13, inverter 17, first multiplier 15, second multiplier 16, and select signal generator 18, for performing the calculations in Formula 3.

The structure of the device in the present embodiment is almost the same as that in the first embodiment except newly added inverter 17. So, the other components have the same numbers as the first embodiment. Inverter 17 alternately outputs inverted data and non-inverted data. Practically, such a circuit which deals with one-bit data is the two-input exclusive OR. The exclusive OR operates as follows: if one of the inputs is H, the other input is inverted and output; and if L, the other not inverted and output as it is.

The operation of the differential detection calculating unit 3 with the above structure is explained with reference to FIG. 6.

Both sampled baseband signals I(nT) and Q(nT) are input respectively to both first selector 11 and second selector 12. First selector 11 operates synchronously with the clock signal from select signal generator 18, and outputs data S1(nT) by selecting alternately I(nT) and Q(nT) which are input simultaneously at every sampling period T. On the other hand, second selector 12 also operates synchronously with the clock signal from select signal generator 18, but selects I(nT) and Q(nT) being different from that selected by first selector 11, to output data S3(nT).

Output S1(nT) from first selector 11 goes two ways, one of which directly enters first multiplier 15, the other is delayed one symbol time mT by delay 13 to change to S1{(n-m)T} and then goes two ways to enter first multiplier 15 and second multiplier 16. First multiplier 15 outputs F3(nT), which is equal to F1(nT) shown in Formula 5.

On the other hand, output S3(nT) of second selector 12 is input to inverter 17. Inverter 17 operates synchronously with the clock signal from select signal generator 18. If S3(nT) =I(nT), inverter 17 inverts the input data to output S4(nT) =–I(nT) into second multiplier 16, and if S3(nT)=Q(nT), keeps the input data as it is to output S4(nT)=Q(nT) into second multiplier 16. Hence S3(nT) and S4(nT) can be expressed as Formula 7 below.

Formula 7

---

For odd number n:
S3(nT)=Q(nT)
S4(nT)=S3(nT)
=Q(nT)
For even number n:
S3(nT)=I(nT)
S4(nT)=–S3(nT)
=–I(nT)

---

Output F4(nT) from second multiplier 16 is expressed as Formula 8

---

For odd number n:
F4(nT)=S4(nT)·S1{(n–m)T}
=Q(nT)·I{(n–m)T}
For even number n:
F4(nT)=S4(nT)·S1{(n–m)T}
=–I(nT)·Q{(n–m)T}

---

As apparent from Formula 8, output F4(nT) of second multiplier 16 is equal to F2(nT) shown in Formula 6.

In this way, detection signals F1(nT)=F3(nT) and F2(nT) =F4(nT) expressed in Formula 3 are generated.

The demodulated baseband signals are generated from the detection signals the same as First Embodiment.

As apparent from the above description, the devices of the present embodiment and First Embodiment have the same function and components, but differ from each other in their compositions. Consequently, the present embodiment, as First Embodiment, realizes the logical circuit of differential detecting device with only two multipliers, one delay and newly put two selectors instead of four multipliers and two delays in the prior art. Furthermore, since two adders used in the prior art are no more required, a number of gates are deleted from the circuit, and it eases realizing the circuit in IC.

Also, different from First Embodiment, the input/output signals to/from first selector 11 and second selector 12 are equal to each other in the present embodiment. This enables reduction in gates when the selectors are realized in IC.

<Third Embodiment>

Figure 7:
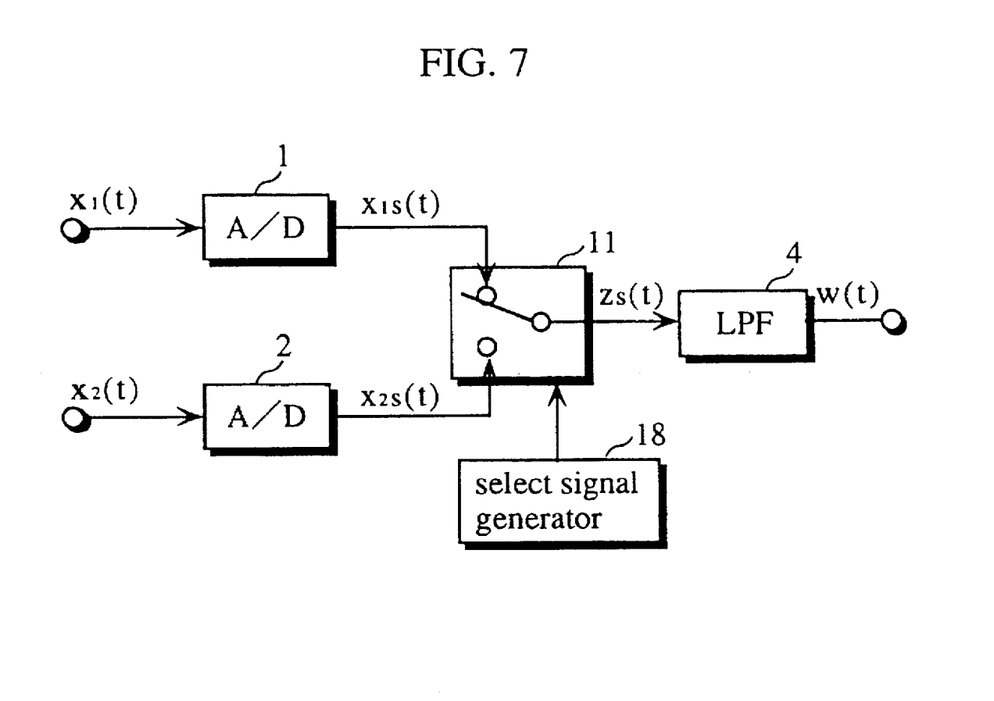
FIG. 7 is a block diagram illustrating the structure of the signal adding device in Third Embodiment of the present invention.

The signal adding device in the third embodiment of the present invention is explained with reference to the figures. FIG. 7 is a block diagram showing the structure of the present device. The components and their numbers are the same as those in First Embodiment.

The present device adds signals x1(t) and x2(t) in digital signal processing. The two signals x1(t) and x2(t) are sampled alternately at every time period T by first and second A/D converters and output as sampled signals x1s(t) and x2s(t) respectively. The sampled signals are added to signal zs(t) by selector 11 then input to lowpass filter 4. Lowpass filter 4 outputs signal w(t), which is the desired added signal.

Figure 8:
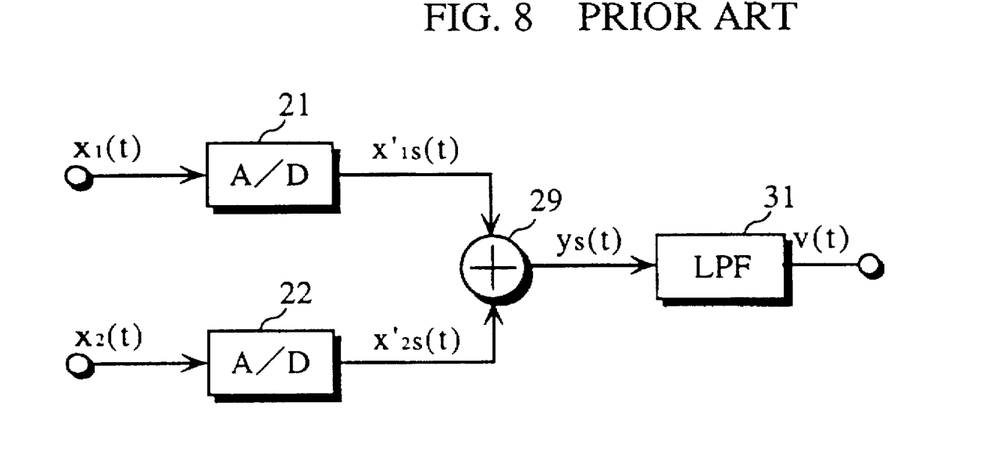
FIG. 8 is a block diagram illustrating the structure of a prior-art signal adding device.

The devices in FIG. 7 and FIG. 8 functions the same. The device in FIG. 8 has the same components and numbers as the prior art differential detecting device shown in FIG. 1. As apparent from the comparison of FIG. 7 with FIG. 8, the present device uses selector 11 instead of adder 29. In the prior art signal adding device, two signals x1(t) and x2(t) are simultaneously sampled by first A/D converter and second A/D converter at every time period 2T and output as sampled signals x'1s(t) and x'2s(t) respectively. The values of the sampled signals are added by adder 29. Adder 29 then inputs signal ys(t) to lowpass filter 31. Lowpass filter 31 outputs signal v(t), which is the desired added signal.

Needless to say, the signal adding device shown in FIG. 7 operates as a part of the differential detecting device in First Embodiment shown in FIG. 2. On the other hand, the prior art signal adding device shown in FIG. 8 operates as a part of the differential detecting device in First Embodiment shown in FIG. 1. For example, signals x1s(t) and x2s(t) respectively correspond to I(nT)·I{(n-m)T} and Q(nT)·Q{(n-m)T} which are respective multiplication results of the sampled inphase and quadrature-phase baseband signals.

Below is explained, with reference to the time-base wave forms and frequency spectrum (Fourier transformation), that added signals w(t), obtained from the present device, and v(t), obtained from the prior art, are equal to each other.

First, principles of addition in the prior art are explained. (a1) and (a2) in FIG. 9 respectively represent time-base wave form x'1s(t) and its frequency spectrum X'1s(f); (b1) and (b2) represent time-base wave form x'2s(t) and its frequency spectrum X'2s(f); (c1) and (c2) represent time-base wave form ys(t) and its frequency spectrum Ys(f); and (d1) and (d2) represent time-base wave form v(t) and its frequency spectrum V(f).

It is assumed that fs=½T, and that X1(f) and X2(f) are respective Fourier-transformed x1(t) and x2(t). It is also assumed that the bandwidth (single-sided) of signals x1(t) and x2(t) is represented by B, and that the cutoff frequency of the lowpass filter is fs-B. When it is assumed that Xs(f) is the sampled signal obtained by sampling the sequential signal x(t), that Fourier-transformed x(t) is X(f), and that Fourier-transformed xs(t) is Xs(f), xs(t) and Xs(f) are expressed as Formula 9 with x(t) and X(f). Hence, it is obvious that spectra (a2) and (b2) shown in FIG. 9 can be obtained.

Figure 9:
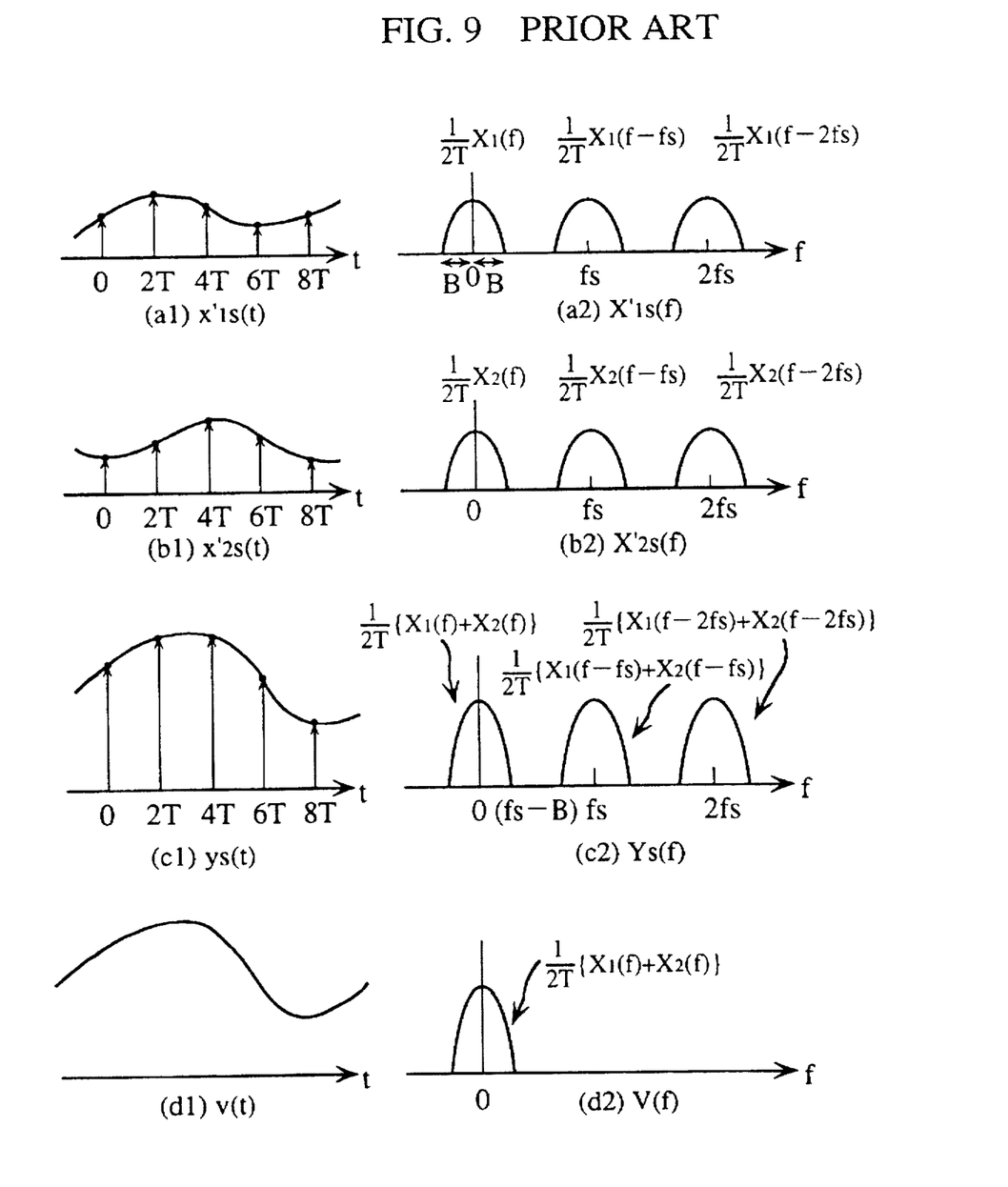
FIG. 9 shows the wave forms and frequency spectra for explaining the addition principles of the prior-art signal adding device.

Formula 9

$$xs(t) = \sum_{n=-\infty}^{\infty} x(2nT)\delta(t-2nT)$$

$$Xs(f) = (1/2T) \sum_{n=-\infty}^{\infty} X(f-nfs)$$

As shown in (d2) in FIG. 9, the spectrum of the added signal obtained by the prior art device is only the baseband component, (½T){X1(f)+X2(f)}.

Figure 10:
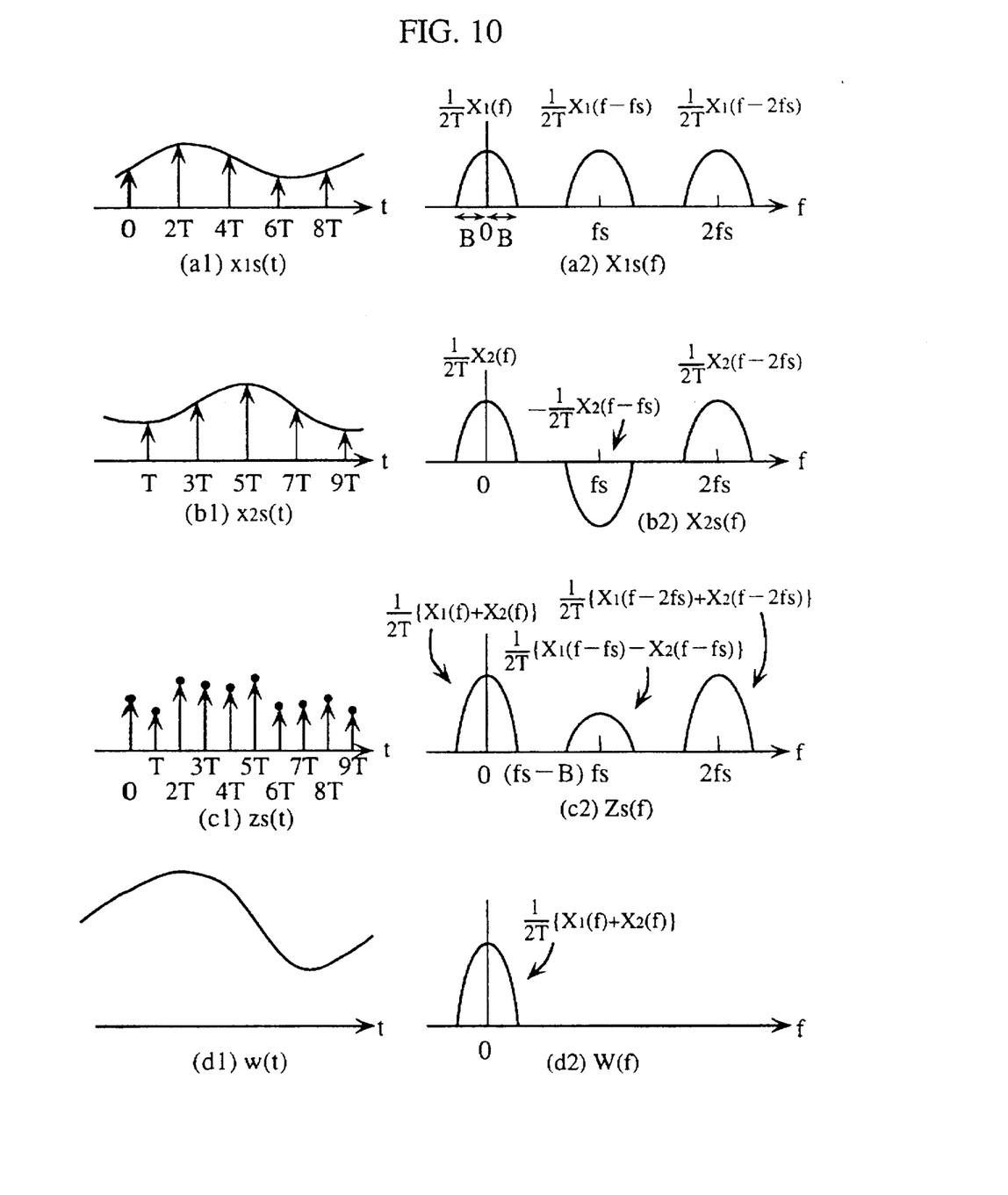
FIG. 10 shows the wave forms and frequency spectra for explaining the addition principles of the signal adding device in Third Embodiment of the present invention.

Then, principles of addition in the present device are explained. (a1) and (a2) in FIG. 10 represent respectively time-base wave form x1s(t) and its frequency spectrum X1s(f); (b1) and (b2) represent time-base wave form x2s(t) and its frequency spectrum X2s(f); (c1) and (c2) represent time-base wave form zs(t) and its frequency spectrum Zs(f); and (d1) and (d2) represent time-base wave form w(t) and its frequency spectrum W(f).

As apparent from the comparison of FIG. 10 with FIG. 9, sampled signal x1s(t) is equal to sampled signal x'1s(t) of the prior art. However, sampled signal x2s(t) is sampled time T later than sampled signal x'2s(t). Generally, sampled signal xs(t) sampled ΔT period later than time 2nT and its Fourier-transformed Xs(f) are expressed as Formula 10 below. From the above fact it follows that the spectrum of (b2) FIG. 10 can be obtained.

Formula 10

$$xs(t) = \sum_{n=-\infty}^{\infty} x(2nT)\delta(t-2nT-\Delta T)$$

$$Xs(f) = (1/2T) \sum_{n=-\infty}^{\infty} X(f-nfs)e-jn\pi(\Delta T/T)$$

As apparent from (c2) in FIG. 10, the frequency spectrum of sampled signal zs(t) differs from sampled signal ys(t) of the prior art only in higher harmonic component at odd numbers. However, since the cutoff frequency of the lowpass filter is fc-B, all higher harmonic components are removed, and the spectrum of the signal finally obtained from the device is only the baseband component (½T){X1(f)+X2(f)} shown in (d2) in FIG. 10. As apparent from the comparison of (d1) and (d2) in FIG. 9 with those in FIG. 10, signal w(t) finally obtained from the device is equal to signal v(t) obtained from the prior art device.

Figure 11:
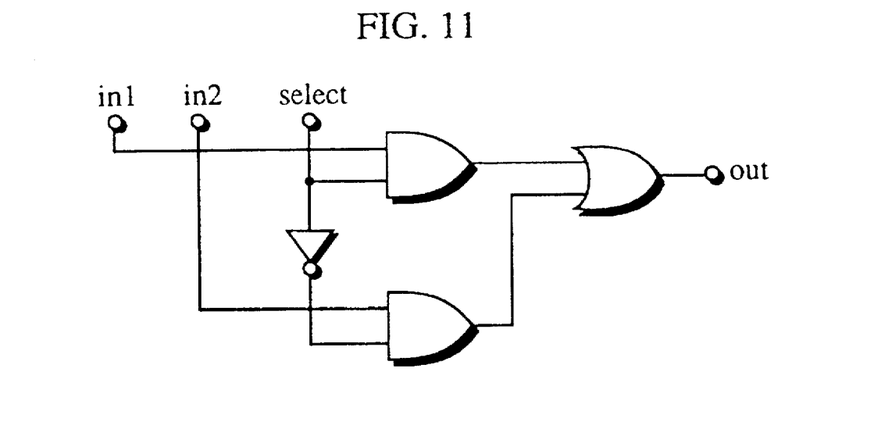
FIG. 11 shows selector 11 in FIG. 7 realized in a circuit with gates.
Figure 12:
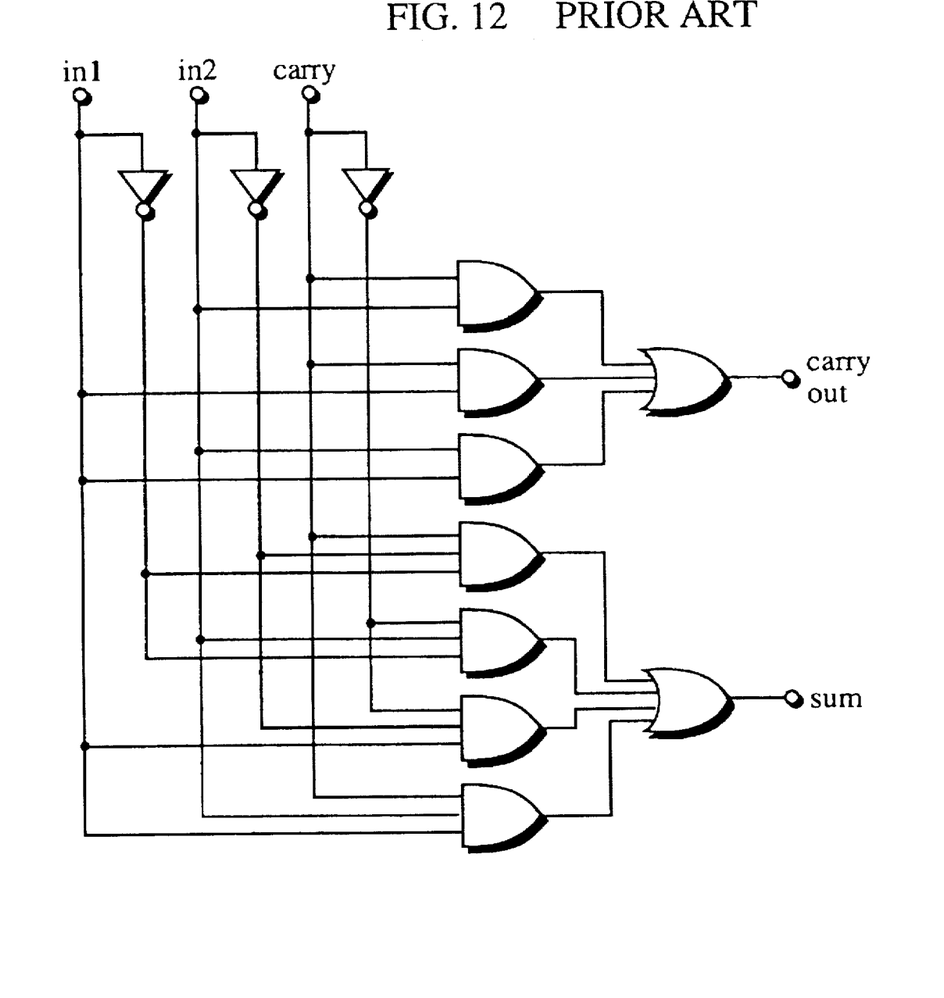
FIG. 12 shows adder 29 in FIG. 8 realized in a circuit with gates.

The above description has made it clear that adder 29 used in the prior art can be replaced with a selector. Note that a selector requires half or less as much gates as an adder. This is clearly understood when a one-bit selector in a circuit with gates as shown in FIG. 11 is compared with a one-bit adder in a circuit with gates as shown in FIG. 12. Of course the number of gates in the present device decreases as the number of bits output from the A/D converter increases.

Consequently, the signal adding device in the present device requires less gates than the prior art, and it eases realizing the device in IC.

The above description has made it clear that the following two methods of adding signals x1(t) and x2(t) in digital signal processing produce the same signal value: sampling signals x1(t) and x2(t) alternately at every time period T, adding the sampled signals x1s(t) and x2s(t) to a signal, and lowpass-filtering the signal; or sampling signals x1(t) and x2(t) simultaneously at every time period 2T, adding the sampled signals x'1s(t) and x'2s(t) to a signal, and lowpass-filtering the signal. As a result, adder 29 in the prior-art device can be replaced with selector 11 in the present device.

Although in the above embodiments the differential detecting device of the present invention is explained in detail, the applications of the invention are not limited to the above embodiments. That is:

(1) in First and Second Embodiments, m, the number of samples per symbol, is assumed to be 4, but it may take any even number which is 2 or more. This is because the present device regenerates a detection signal at every other sampling.

(2) First and second A/D converters in First and Second Embodiments output eight-bit data and the other components also handle eight-bit data. However, the number of bits is not limited to eight. Generally, the number of bits is determined by the tradeoff between the quantization accuracy required in digital signal processing and the number of gates required in the device realized in IC.

(3) Though two signals are input to the device in Third Embodiment, three or more signals can be input to the device. Unnecessary to say, if the input signals are sequentially sampled at intervals of time period T and the sampled signals are input to lowpass filter with cutoff frequency (1/nT)-B, a added signal of n input signals is obtained.

Figure 13:
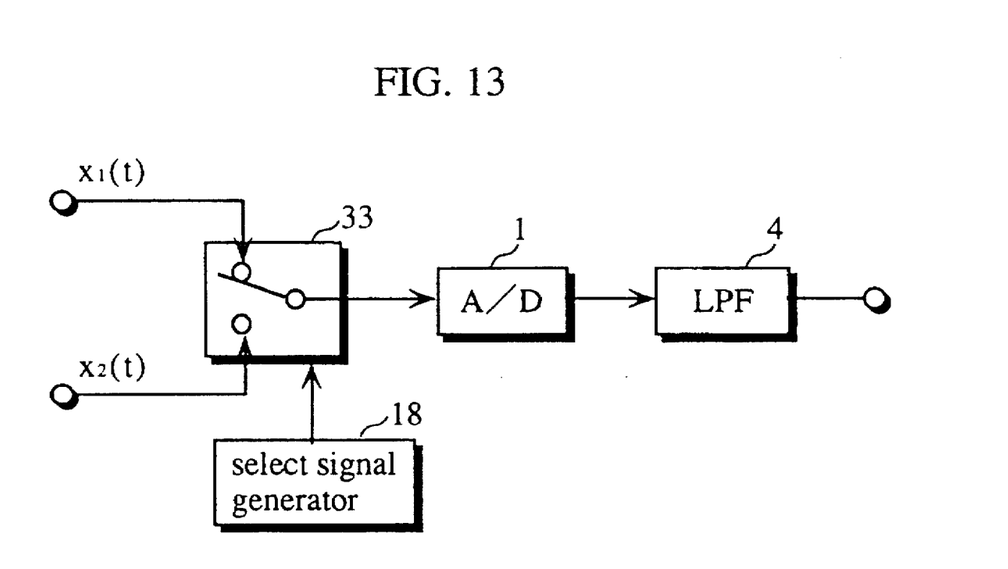
FIG. 13 is a block diagram illustrating the structure of a variation of the signal adding device in Third Embodiment of the present invention.
Figure 14:
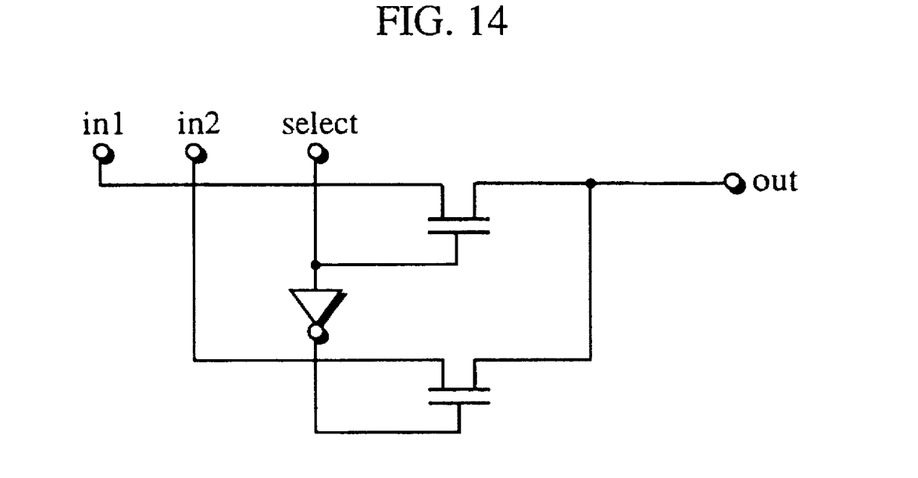
FIG. 14 shows the circuit of selector 33 for analog signals used in the variation of the signal adding device shown in FIG. 13.

(4) In Third Embodiment, signals x1(t) and x2(t) are first digitized and then input to selector 11. However, signals x1(t) and x2(t) can be first input to the selectors as analog signals and then digitized (the structure is shown in FIG. 13). It enables the reduction in the number of necessary A/D converters. Also, selector 33 for analog signals in FIG. 13 can be replaced with the MOS transistor as shown in FIG. 14.

What is claimed is:

1. A differential detecting device for detecting, from inphase and quadrature-phase baseband signals which are obtained by a quadrature detection on a phase-modulated signal, cosine and sine components of a phase difference at two instants of said phase-modulated signal, comprising:

two A/D converters for digitizing and converting said inphase and quadrature-phase baseband signals to respective inphase data and quadrature-phase data at every predetermined time period (sampling period);

a cosine component calculating means for calculating said cosine component by alternately selecting said inphase data and said quadrature-phase data;

a sine component calculating means for calculating said sine component by alternately selecting said inphase data and said quadrature-phase data; and two lowpass filters for respectively receiving said cosine component calculated by said cosine component calculating means and said sine component calculated by said sine component calculating means, and for cutting frequency components whose frequencies are higher than a first predetermined frequency level from said received cosine and sine components, and passing frequency components of said received cosine and sine components whose frequencies are lower than a second predetermined frequency level, said second predetermined frequency level being lower than said first frequency level.

2. The differential detecting device of claim 1 wherein said cosine component calculating means comprises:

a first selector for alternately selecting said inphase data and said quadrature-phase data at every said sampling period;

a delay for delaying data selected by said first selector for said predetermined number of sampling periods; and a first multiplier for multiplying data selected by said first selector by data delayed by said delay; and wherein said sine component calculating means comprises:

an inverter for inverting said inphase data;

a second selector, operating synchronously with said first selector, for selecting said quadrature-phase data when said first selector selects said inphase data, and selecting output data of said inverter when said first selector selects said quadrature-phase data; and a second multiplier for multiplying data selected by said second selector by data delayed by said delay.

3. The differential detecting device of claim 6 wherein said cosine component calculating means comprises:

a first selector for alternately selecting said inphase data said quadrature-phase data at every said sampling period;

a delay for delaying data selected by said first selector for said predetermined number of sampling periods; and a first multiplier for multiplying data selected by said first selector by data delayed by said delay; and wherein said sine component calculating means comprises:

a second selector, operating synchronously with said first selector, for selecting said quadrature-phase data when said first selector selects said inphase data, and selecting said inphase data when said first selector selects said quadrature-phase data;

an inverter for inverting and outputting said inphase data selected by said second selector and outputting said quadrature-phase data selected by said second selector without inverting said quadrature-phase data; and a second multiplier for multiplying data output from said inverter by data delayed by said delay.

4. A differential detecting device for detecting, from inphase and quadrature-phase baseband signals which are obtained by a quadrature detection on a phase-modulated signal, cosine and sine components of a phase difference at two instants of said phase-modulated signal, comprising:

two A/D converters for digitizing and converting said inphase and quadrature-phase baseband signals to respective inphase data and quadrature-phase data at every predetermined time period (sampling period);

a cosine component calculating means for calculating said cosine component by alternately selecting said inphase data and said quadrature-phase data, wherein said cosine component calculating means comprises:

a first selector for alternately selecting said inphase data and said quadrature-phase data at every said sampling period;

a delay for delaying data selected by said first selector for said predetermined number of sampling periods; and a first multiplier for multiplying data selected by said first selector by data delayed by said delay;

a sine component calculating means for calculating said sine component by alternately selecting said inphase data and said quadrature-phase data, wherein said sine component calculating means comprises:

an inverter for inverting said inphase data;

a second selector, operating synchronously with said first selector, for selecting said quadrature-phase data when said first selector selects said inphase data, and selecting output data of said inverter when said first selector selects said quadrature-phase data; and a second multiplier for multiplying data selected by said second selector by data delayed by said delay; and two lowpass filters for respectively receiving said cosine component calculated by said cosine component calculating means and said sine component calculated by said sine component calculating means, and for cutting frequency components whose frequencies are higher than a first predetermined frequency level from said received cosine and sine components, and passing frequency components of said received cosine and sine components whose frequencies are lower than a second predetermined frequency level, said second predetermined frequency level being lower than said first frequency level.

5. A differential detecting device for detecting, from inphase and quadrature-phase baseband signals which are obtained by a quadrature detection on a phase-modulated signal, cosine and sine components of a phase difference at two instants of said phase-modulated signal, comprising:

two A/D converters for digitizing and converting said inphase and quadrature-phase baseband signals to respective inphase data and quadrature-phase data at every predetermined time period (sampling period);

a cosine component calculating means for calculating said cosine component by alternately selecting said inphase data and said quadrature-phase data, wherein said cosine component calculating means comprises:

a first selector for alternately selecting said inphase data said quadrature-phase data at every said sampling period;

a delay for delaying data selected by said first selector for said predetermined number of sampling periods; and a first multiplier for multiplying data selected by said first selector by data delayed by said delay;

a sine component calculating means for calculating said sine component by alternately selecting said inphase data and said quadrature-phase data, wherein said sine component calculating means comprises:

a second selector, operating synchronously with said first selector, for selecting said quadrature-phase data when said first selector selects said inphase data, and selecting said inphase data when said first selector selects said quadrature-phase data; an inverter for inverting and outputting said inphase data selected by said second selector and outputting said quadrature-phase data selected by said second selector without inverting said quadrature-phase data; and a second multiplier for multiplying data output from said inverter by data delayed by said delay; and two lowpass filters for respectively receiving said cosine component calculated by said cosine component calculating means and said sine component calculated by said sine component calculating means, and for cutting frequency components whose frequencies are higher than a first predetermined frequency level from said received cosine and sine components, and passing frequency components of said received cosine and sine components whose frequencies are lower than a second predetermined frequency level, said second predetermined frequency level being lower than said first frequency level.

* * * * *